US006646514B2

(12) United States Patent
Sutliff et al.

(10) Patent No.: US 6,646,514 B2
(45) Date of Patent: Nov. 11, 2003

(54) SYSTEM AND METHOD FOR REDUCING STARTUP TIME IN A TEMPERATURE CONTROLLED CRYSTAL OSCILLATOR

(75) Inventors: Richard N. Sutliff, South Elgin, IL (US); Jaroslaw E. Adamski, Streamwood, IL (US); Ammar Yasser Rathore, Emmaus, PA (US); Iyad Alhayek, Schaumburg, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/026,916

(22) Filed: Dec. 27, 2001

(65) Prior Publication Data

US 2002/0084863 A1 Jul. 4, 2002

Related U.S. Application Data

(60) Provisional application No. 60/258,471, filed on Dec. 28, 2000.

(51) Int. Cl.[7] .............................. H03B 5/04; H03B 5/06; H03B 5/36
(52) U.S. Cl. ..................... 331/173; 331/66; 331/158; 331/177 V; 331/179
(58) Field of Search ...................... 331/65, 66, 180 D, 331/116 R, 116 FE, 158, 172, 173, 175, 176, 177 R, 177 V, 179

(56) References Cited

U.S. PATENT DOCUMENTS

| 5,481,229 A | | 1/1996 | Connell et al. |
|---|---|---|---|
| 5,548,252 A | * | 8/1996 | Watanabe et al. ........... 331/176 |
| 5,760,656 A | | 6/1998 | Sutliff et al. |
| 5,777,524 A | | 7/1998 | Wojewoda et al. |
| 5,977,840 A | | 11/1999 | Connell et al. |

* cited by examiner

*Primary Examiner*—David C. Mis
(74) *Attorney, Agent, or Firm*—Jon P. Christensen; Steven Weseman

(57) ABSTRACT

A method and apparatus are provided for reducing a startup interval of a temperature controlled crystal oscillator chip. The method includes the steps of connecting an operating circuit of the temperature controlled crystal oscillator chip into a first configuration to reduce the startup interval following application of power and reconnecting the operating circuit into a second configuration after a predetermined time period.

21 Claims, 3 Drawing Sheets

SYSTEM AND METHOD FOR REDUCING STARTUP TIME IN A TEMPERATURE CONTROLLED CRYSTAL OSCILLATOR

CROSS REFERENCE TO RELATED APPLICATION

This application claims the benefit of the filing date of U.S. Provisional patent application Ser. No. 60/258,471, filed Dec. 28, 2000, which is explicitly incorporated by reference, as are all references cited therein.

FIELD OF THE INVENTION

The field of the invention relates to oscillators and more particularly to temperature controlled crystal oscillators.

BACKGROUND OF THE INVENTION

Temperature controlled crystal oscillators (TCXOs) are generally known. Such devices are typically constructed in the form of a crystal and a controlling chip. Within the controlling chip, a set of switchable capacitors and a feedback amplifier form a tank circuit that oscillates at a frequency determined by the amount of capacitance switched into the tank circuit. By providing multiple capacitors that can be switched into and out of the tank circuit, the frequency at which the crystal oscillates can be varied. An internal power supply functions to drive the tank circuit at the predetermined frequency.

A temperature sensor is typically provided within the chip for sensing a temperature near the crystal. Based upon the temperature sensed, a controller switches capacitors into and out of the tank circuit based upon a performance criteria of the tank circuit. The performance criteria are typically stored in a lookup table within the TCXO chip.

However, consumers of TCXOs are demanding TCXOs with increasingly fast startup times while maintaining very low power consumption levels during ongoing operation.

During startup of the TCXO, however, the TCXO must execute numerous program instructions to begin oscillation of the crystal at the required frequency. Therefore, a CPU within the TCXO is required to operate at a high clock rate in order to accomplish this fast startup task. For example, during startup, a CPU of the TCXO must initialize, read a current temperature, retrieve operating characteristics at that temperature from a lookup table and program the operating parameters into the oscillator circuit within a very short time period (e.g., less than 1 ms).

The high clock rate of the CPU, however, greatly increases the power consumption of the TCXO. Therefore, a need exists for a TCXO that has a very fast startup time while maintaining low power consumption during ongoing operation.

As used herein, the term "startup time" refers to the time interval between application of power to the TCXO and the instant when the TCXO reaches and maintains an operating frequency which conforms to its published operating parameters (e.g., 1 part per million frequency variation).

SUMMARY OF THE INVENTION

A method and apparatus are provided for reducing a startup interval of a temperature controlled crystal oscillator chip. The method includes the steps of connecting an operating circuit of the temperature controlled crystal oscillator chip into a first configuration to reduce the startup interval following application of power and reconnecting the operating circuit into a second configuration after a predetermined time period.

DETAILED DESCRIPTION OF A PREFERRED EMBODIMENT

Figure 1:
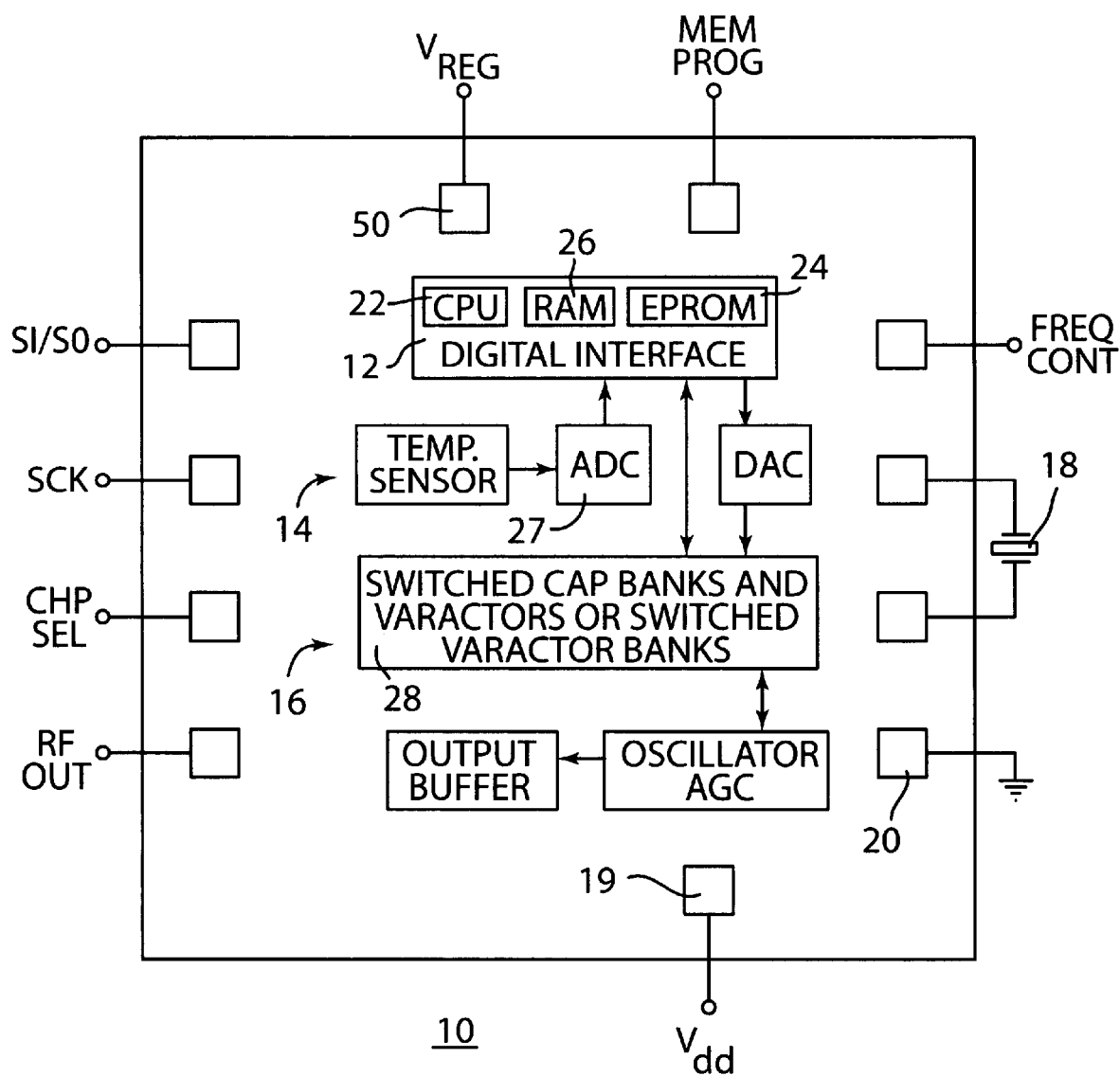
FIG. 1 is a block diagram of a TCXO system in accordance with an illustrated embodiment of the invention.

Referring to FIG. 1, there is shown a block diagram of a TCXO chip 10 in accordance with a preferred embodiment of the invention. Included within the TCXO 10 are a digital controller 12, a temperature sensor 14 and an oscillator circuit 16. Also, provided is a crystal oscillator 18. The digital controller 12 further comprises a CPU 22, and EPROM 24 and RAM 26. The temperature sensor 14 communicates with the digital controller 12 through an analog to digital converter 27. The digital controller 12 also communicates with a bank of switched capacitors 28

To accomplish startup of the TCXO 10, a supply voltage is applied across a set of supply terminals 19, 20. Upon application of the supply voltage, a CPU 22 begins an initialization routine. The CPU 22 loads an operating program from an EPROM 24 into a RAM 26 and begins executing that program.

As the CPU 22 begins executing the program, the CPU 22 retrieves a current temperature from the temperature sensor 14. Using the temperature as an index, the CPU 22 enters a lookup table (not shown) in the EPROM 24 for a set of oscillator operating parameters. The oscillator operating parameters specify a capacitance value to switch into the oscillator circuit 16 to achieve a stable predetermined operating frequency at that temperature.

In order to reduce the startup interval, the CPU 22 is equipped with a programmable clock (not shown) operable in either a first or second configuration. In a first configuration during startup, the CPU 22 is supplied with a fast clock. After a predetermined time period, the rate of the clock supplied to the CPU 22 is reduced significantly. The use of a slower clock after initialization significantly reduces power consumption.

The use of a programmable clock offers other benefits in addition to reduced power consumption. For example, the fast clock on startup allows the CPU 22 to pass through initialization very rapidly (e.g., less than 2 milliseconds). Rapid initialization allows the TCXO 10 to be deactivated between uses, further reducing power consumption. The ability to deactivate circuit components has great value in some portable electronic devices (e.g., pagers, radiotelephones, etc.).

Figure 2:
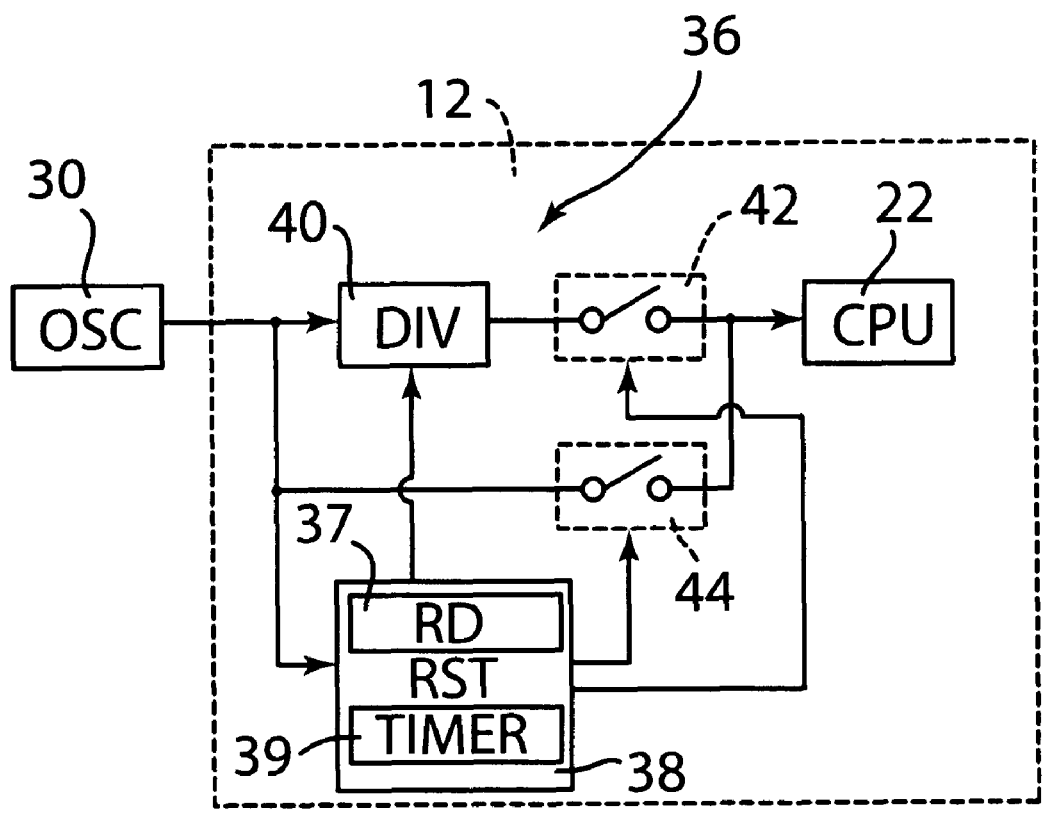
FIG. 2 is a block diagram of a programmable clock that may be used with the system of FIG. 1.

FIG. 2 is a block diagram that depicts the programmable clock 36. As shown, the programmable clock 36 includes a divider 40 and a reset (RST) circuit 38. The RST 38 includes a reset detector 37 and a timer 39. The RST 38 is used to control first and second switches 42, 44. In a first configuration, the first switch 42 is closed to apply a clock signal to the CPU 22 directly from the oscillator 30. In a second configuration, the first switch 42 is opened and the second switch 44 closed to provide a divided clock signal to the CPU 22.

The reset circuit 38 comprises a resistor-capacitor (RC) timing circuit or a counter. In either case, the RST 38 is constructed to provide controlling signals to the switches 42, 44.

Where the RST 38 is constructed of a RC circuit, the resistor and capacitor is chosen to allow the capacitor to charge to a predetermined voltage level within the predetermined time period. The capacitor is coupled to the power supply through the resistor or a diode and resistor is used to charge the capacitor using the oscillator signal as a driving signal. When the capacitor reaches the predetermined voltage, a comparator (not shown) is used to provide a driving signal to open the first switch 42 and close the second switch 44.

Alternatively, the RST 38 can be constructed in the form of a programmable counter. When constructed as a counter, the RST 38 counts the number of pulses provided by the oscillator 30. By knowing the oscillator frequency, the counter can be programmed (i.e., loaded) with the number of cycles (maximum count) provided by the oscillator during the predetermined time period. When the count equals the maximum count, the RST 38 provides a control signal to the switches 42, 44.

Under other embodiments, the divider 40 can be a programmable divider 40 that changes from a first configuration to a second configuration upon application of a control signal from the RST 38. The programmable divider 40 is connected to provide a divide by one function when powered up. After receipt of the control signal from the RST 38, the programmable divider 40 is reconnected to divide by a value equal to n. For example, if the oscillator 30 were to operate at a first frequency (e.g., 13–30 MHz), then the CPU 22 would process information at the oscillator frequency (i.e., 13–30 MHz) during the predetermined startup period. After the predetermined time period, the programmable counter 40 will divide the oscillator frequency by a predetermined divide value (e.g., 130–300) to achieve a much lower predetermined CPU clock speed (e.g., 100 kHz).

Figure 3:
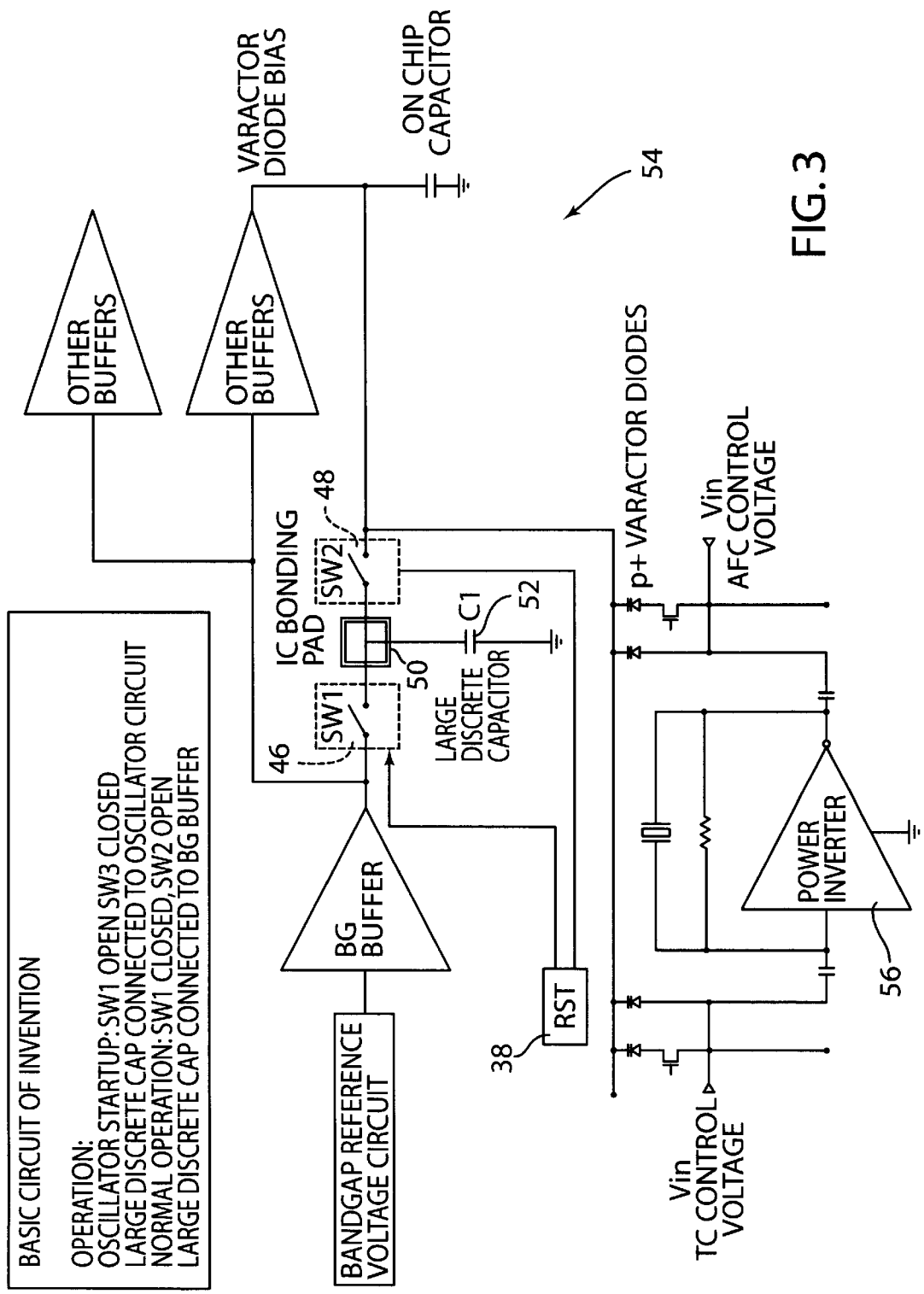
FIG. 3 is a block diagram of an oscillator circuit that may be used with the system of FIG. 1.

FIG. 3 depicts another portion of the operating circuit of the TCXO 10. Under the illustrated embodiment shown in FIG. 3, first and second switches 46, 48 are used to alternatively provide additional capacitance to the oscillator 30 during startup and to provide capacitance to a bandgap buffer after startup. Upon application of power to the TCXO 10, the first switch 46 is open and the second switch 48 is closed. After the predetermined period, the first switch 46 is closed and the second switch 48 is opened.

A relatively large discrete capacitor 52 is provided for use in conjunction with the TCXO 10. The capacitor 52 is connected between the external bonding pad 50 and ground. During startup the first switch 48 connects the capacitor 52 into the oscillator circuit 54 to reduce startup time. After startup, the first switch 48 opens and the second switch 46 closes. Closing of the second switch 46 allows the capacitor 52 to be connected into the power supply as a bandgap filter to reduce phase noise.

The oscillator 54 may be any conventional arrangement (e.g., a gate oscillator). Connection of the capacitor 52 to the cathodes of the varactor diodes has been found to increase the gain in the oscillator loop that is provided by the amplifier 56. Increasing the gain in the oscillator loop of the amplifier 56 results in a significantly faster startup of the oscillator 54.

As a result of these improvements a contact pad for the TCXO is eliminated and phase noise is greatly reduced.

A specific embodiment of a method and apparatus for providing a TCXO according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

We claim:

1. A method of reducing a startup interval of a temperature controlled crystal oscillator chip, such method comprising the steps of:
    connecting an operating circuit of the temperature controlled crystal oscillator chip into a first configuration to reduce the startup interval following application of power; and
    reconnecting the operating circuit into a second configuration after a predetermined time period.

2. The method of reducing a startup interval as in claim 1 further comprising disposing a frequency divider in series with a clock signal provided to a processor of the operating circuit of the temperature controlled crystal oscillator.

3. The method of reducing a startup interval as in claim 2 wherein the step of disposing a frequency divider in series with a processor of the operating circuit further comprises programming the divider with a divisor having a value of one during the first configuration.

4. The method of reducing a startup interval as in claim 2 wherein the step of disposing a frequency divider in series with a processor of the operating circuit further comprises programming the divider with a divisor having a value greater than one during the second configuration.

5. The method of reducing a startup interval as in claim 1 further comprising providing a relatively large discrete capacitor coupled between a bonding pad of the temperature controlled crystal oscillator chip and a grounding connection.

6. The method of reducing a startup interval as in claim 1 wherein the step of providing a relatively large discrete capacitor coupled between a bonding pad of the temperature controlled crystal oscillator and a grounding connection further comprises connecting the bonding pad and connected discrete capacitor into the operating circuit as a band gap filter during the second configuration.

7. The method of reducing a startup interval as in claim 1 wherein the step of providing a relatively large discrete capacitor coupled between a bonding pad of the temperature controlled crystal oscillator and a grounding connection further comprises connecting the bonding pad to an anode of a varactor of a gate oscillator of the operating circuit during the first configuration.

8. An apparatus for reducing a startup interval of a temperature controlled crystal oscillator chip, such apparatus comprising:
    means for connecting an operating circuit of the temperature controlled crystal oscillator chip into a first configuration to reduce the startup interval following application of power; and
    means for reconnecting the operating circuit into a second configuration after a predetermined time period.

9. The apparatus for reducing a startup interval as in claim 8 further comprising means for disposing a frequency divider in series with a clock signal provided to a processor of the operating circuit of the temperature controlled crystal oscillator.

10. The apparatus for reducing a startup interval as in claim 9 wherein the means for disposing a frequency divider in series with a processor of the operating circuit further comprises means for programming the divider with a divisor having a value of one during the first configuration.

11. The apparatus for reducing a startup interval as in claim 9 wherein the means for disposing a frequency divider in series with a processor of the operating circuit further comprises means for programming the divider with a divisor having a value greater than one during the second configuration.

12. The apparatus for reducing a startup interval as in claim 8 further comprising means for providing a relatively large discrete capacitor coupled between a bonding pad of the temperature controlled crystal oscillator chip and a grounding connection.

13. The apparatus for reducing a startup interval as in claim 8 wherein the means for providing a relatively large discrete capacitor coupled between a bonding pad of the temperature controlled crystal oscillator and a grounding connection further comprises means for connecting the bonding pad and connected discrete capacitor into the operating circuit as a band gap filter during the second configuration.

14. The apparatus for reducing a startup interval as in claim 8 wherein the means for providing a relatively large discrete capacitor coupled between a bonding pad of the temperature controlled crystal oscillator and a grounding connection further comprises means for connecting the bonding pad to an anode of a varactor of a gate oscillator of the operating circuit during the first configuration.

15. An apparatus for reducing a startup interval of a temperature controlled crystal oscillator chip, such apparatus comprising:
   a reset detector adapted to connect an operating circuit of the temperature controlled crystal oscillator chip into a first configuration to reduce the startup interval following application of power; and
   a timer adapted to reconnect the operating circuit into a second configuration after a predetermined time period.

16. The apparatus for reducing a startup interval as in claim 15 further comprising a frequency divider disposed in series with a clock signal provided to a processor of the operating circuit of the temperature controlled crystal oscillator.

17. The apparatus for reducing a startup interval as in claim 16 wherein the frequency divider in series with a processor of the operating circuit further comprises a first input adapted to programming the divider with a divisor having a value of one during the first configuration.

18. The apparatus for reducing a startup interval as in claim 16 wherein the frequency divider in series with a processor of the operating circuit further comprises a second input adapted to programming the divider with a divisor having a value greater than one during the second configuration.

19. The apparatus for reducing a startup interval as in claim 15 further comprising a relatively large discrete capacitor coupled between a bonding pad of the temperature controlled crystal oscillator chip and a grounding connection.

20. The apparatus for reducing a startup interval as in claim 15 wherein the relatively large discrete capacitor coupled between a bonding pad of the temperature controlled crystal oscillator and a grounding connection further comprises a first switch adapted to connect the bonding pad and connected discrete capacitor into the operating circuit as a band gap filter during the second configuration.

21. The apparatus for reducing a startup interval as in claim 15 wherein the relatively large discrete capacitor coupled between a bonding pad of the temperature controlled crystal oscillator and a grounding connection further comprises a second switch adapted to connect the bonding pad to an anode of a varactor of a gate oscillator of the operating circuit during the first configuration.

* * * * *